(12) United States Patent
Nabeshima et al.

(10) Patent No.: US 7,978,043 B2
(45) Date of Patent: Jul. 12, 2011

(54) SEMICONDUCTOR DEVICE

(75) Inventors: Yutaka Nabeshima, Osaka (JP); Yuichi Hirofuji, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/846,451

(22) Filed: Jul. 29, 2010

(65) Prior Publication Data

US 2010/0289608 A1    Nov. 18, 2010

Related U.S. Application Data

(63) Continuation of application No. PCT/JP2009/005518, filed on Oct. 21, 2009.

(30) Foreign Application Priority Data

Nov. 6, 2008   (JP) .................. 2008-285140

(51) Int. Cl.
*H01F 5/00*   (2006.01)
(52) U.S. Cl. ..................................... 336/200
(58) Field of Classification Search ............ 336/65, 336/200, 206–208, 232; 257/531
See application file for complete search history.

(56) References Cited

U.S. PATENT DOCUMENTS

| 6,800,533 | B1 * | 10/2004 | Yeo et al. ............ 438/381 |
| 6,922,127 | B2 * | 7/2005 | Zou et al. ............ 336/200 |
| 7,280,024 | B2 * | 10/2007 | Braunisch ............ 336/200 |
| 7,355,264 | B2 * | 4/2008 | Degani et al. ......... 257/531 |
| 7,545,014 | B2 * | 6/2009 | Wang et al. .......... 257/443 |
| 2004/0152276 | A1 | 8/2004 | Nishimura |
| 2007/0035020 | A1 | 2/2007 | Umemoto |
| 2007/0164414 | A1 | 7/2007 | Dokai et al. |
| 2008/0061983 | A1 | 3/2008 | Dokai et al. |
| 2009/0135079 | A1 | 5/2009 | Dokai et al. |

FOREIGN PATENT DOCUMENTS

| JP | 02-232962 | 9/1990 |
| JP | 06-120036 | 4/1994 |
| JP | 07-183468 | 7/1995 |
| JP | 3063422 | 5/2000 |
| JP | 2002-289782 | 10/2002 |
| JP | 2002-353030 | 12/2002 |
| JP | 2004-221284 | 8/2004 |
| JP | 2006-203176 | 8/2006 |
| JP | 2008-148345 | 6/2008 |

* cited by examiner

*Primary Examiner* — Tuyen Nguyen
(74) *Attorney, Agent, or Firm* — McDermott Will & Emery LLP

(57) ABSTRACT

A semiconductor device includes a semiconductor substrate including at least one of a circuit and a circuit element, and an inductor element having a coil axis extending in a direction parallel to a main surface of the semiconductor substrate and disposed adjacent to the main surface. A main direction of a magnetic field induced by passing a current through the inductor element is parallel to the main surface.

18 Claims, 8 Drawing Sheets

FIG.1
(a)
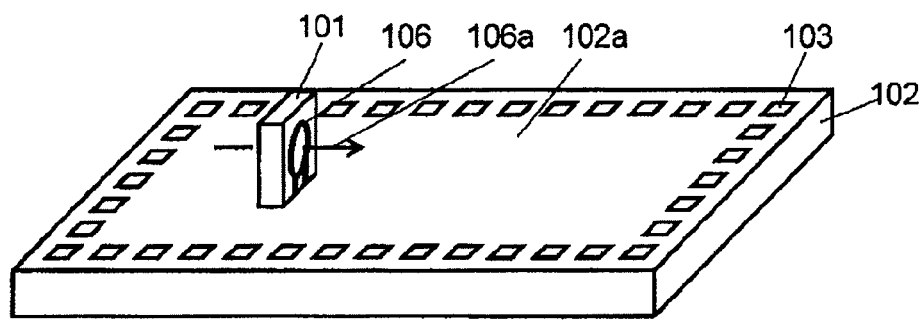
(b)
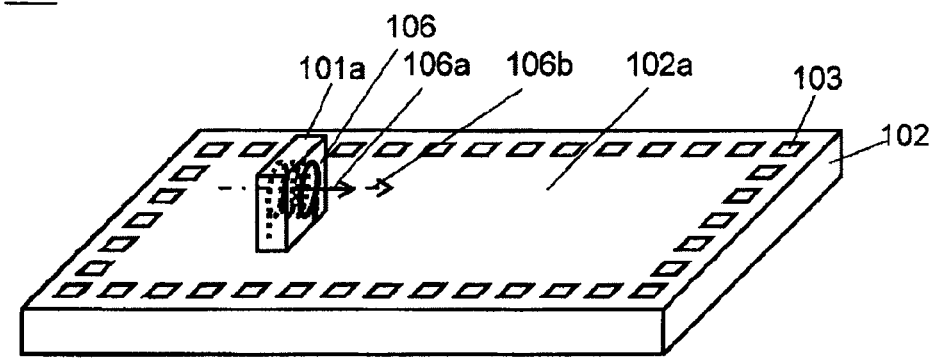
(c)
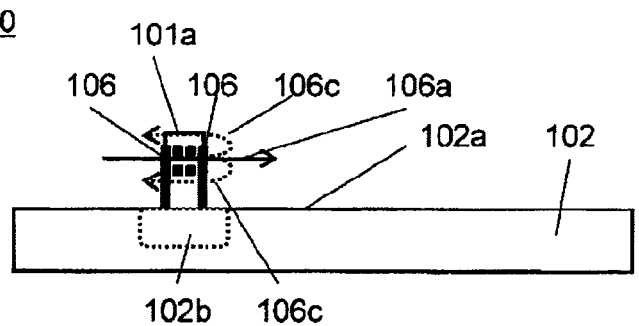

FIG.8
(a)
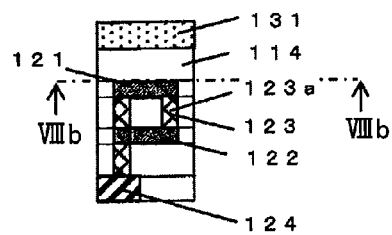
(b)
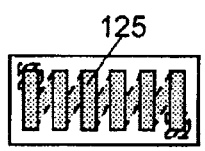
(c)
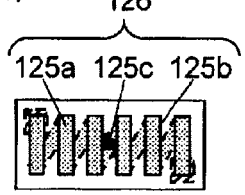
(d)
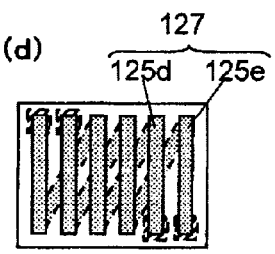
FIG.9
(a)
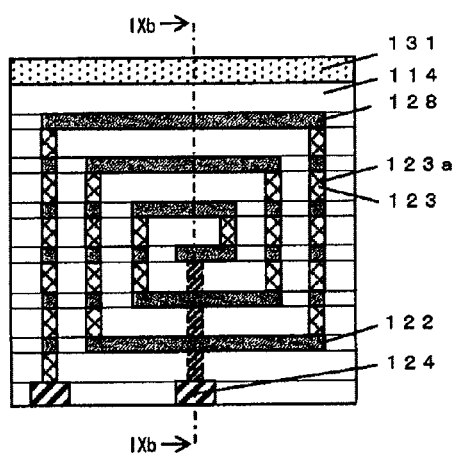
(b)
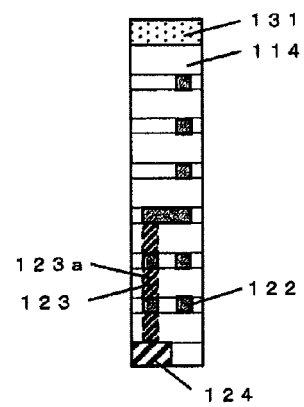

(a) (b)

300

SEMICONDUCTOR DEVICE

CROSS-REFERENCE TO RELATED APPLICATIONS

This is a continuation of PCT International Application PCT/JP2009/005518 filed on Oct. 21, 2009, which claims priority to Japanese Patent Application No. 2008-285140 filed on Nov. 6, 2008. The disclosures of these applications including the specifications, the drawings, and the claims are hereby incorporated by reference in their entirety.

BACKGROUND

The present disclosure relates to semiconductor devices including an inductor element.

In recent years, there has been an increasing demand for high-frequency circuits which are each implemented as a one-chip silicon integrated circuit in order to reduce the sizes of mobile communication apparatuses, such as mobile telephones and the like. However, the high-frequency circuit needs to include, as components, a transistor, a resistor, and a capacitor, and in addition, an inductor element, such as a coil or a transformer. Therefore, a method has been developed for forming, on a semiconductor substrate, an inductor element as well as an integrated circuit including a transistor, a resistor, and the like.

There is a method for forming a conductive film made of aluminum or the like which is in the shape of a spiral or a winding, as an inductor element, on an insulating film formed on a surface of a semiconductor substrate. In such a structure, however, the semiconductor substrate is disposed adjacent to the inductor element, and therefore, an eddy current which reduces a change in magnetic flux occurring when a current is passed through the inductor element, occurs in the semiconductor substrate. In this case, it is known that because the inductor element interacts with the eddy current occurring in the semiconductor substrate, there is a loss in a characteristic of the inductor element included in the semiconductor device.

Specifically, if the strip-like conductive layer in the shape of a spiral or a winding is assumed to be the primary coil of a transformer, the semiconductor substrate itself containing an impurity, which has a low resistance value, acts as a short-circuited secondary coil in a high-frequency region. The presence of the secondary coil causes a significant loss, particularly in the high-frequency region. Therefore, a technique of reducing the eddy current in the semiconductor substrate has been proposed (see, for example, Japanese Patent Publication No. H07-183468 (hereinafter referred to as Patent Document 1)).

Patent Document 1 describes that a plurality of P-N junctions are formed in a surface of a silicon semiconductor substrate, and an eddy current can be reduced in depletion layers which are generated in the P-N junctions and from which carriers are removed. Specifically, the path of the eddy current in the semiconductor substrate surface is segmented by the depletion layers to reduce the eddy current. Patent Document 1 also mentions a conventional example in which the eddy current is reduced by a depletion layer formed in the substrate surface.

FIG. 13 is a schematic diagram showing a structure of a conventional inductor element formed in a semiconductor device.

As shown in FIG. 13, a conductive film 16 having a spiral shape is formed on a surface of the semiconductor substrate 10. N-type impurity regions 14 are formed in the P-type semiconductor substrate 10 in the vicinity of the surface thereof, extending in the depth direction of the semiconductor substrate 10. In other words, a plurality of P-N junctions are formed in the vicinity of the surface of the semiconductor substrate 10.

The spiral-shaped conductive film 16 is formed on an insulating film 12. One end 16a of the conductive film 16 is connected to an interconnect (not shown). The other end 16b of the conductive film 16 is connected to an underlying interconnect 18 formed in the insulating film 12. When a current is passed through the conductive film 16 from the end 16a to the end 16b in a direction indicated an arrow 22, magnetic flux 20 is generated in the spiral interconnect.

According to the structure of FIG. 13, a plurality of depletion layers are formed in a plurality of P-N junctions, and therefore, a large number of depletion layers are formed in the surface of the semiconductor substrate 10. As a result, it is possible to increase the resistance to an eddy current which is generated in the semiconductor substrate 10 by the magnetic flux 20 generated by the inductor element made of the conductive film 16, whereby the eddy current can be reduced. Therefore, a reduction in an inductance characteristic due to a loss in the power and a reduction in the inductance which are caused by the eddy current can be reduced.

SUMMARY

In the aforementioned conventional technique, the width of the depletion layer for reducing an eddy current is finite, and therefore, it is difficult to prevent an eddy current from occurring in the semiconductor substrate below the depletion layer. Specifically, because the width and thickness of the depletion layer formed in the semiconductor substrate adjacent to the inductor element are finite, and the magnetic permeability of silicon is close to one, a most portion of the magnetic flux transmits through the depletion layer and reaches the semiconductor substrate below the depletion layer to induce an eddy current in the lower portion of the semiconductor substrate. Thus, the eddy current cannot be completely eliminated, resulting in a reduction in the inductor characteristic, which is a problem.

Moreover, because it is necessary to form the depletion layer for reducing an eddy current in the semiconductor substrate, a circuit element cannot be formed in the semiconductor substrate adjacent to the inductor element. The requirement of the depletion layer imposes a large constraint on a layout design for disposing a circuit in the semiconductor substrate. In addition, because the inductor element typically requires a large area, a depletion layer having a large area is required, resulting in a large chip size, which is also a problem.

In view of the foregoing, the detailed description describes implementations of a semiconductor device in which an inductor element is disposed adjacent to a semiconductor substrate and is oriented in a predetermined direction so that a magnetic field induced by the inductor element does not affect the semiconductor substrate, e.g., does not induce an eddy current in the semiconductor substrate, and a circuit element or the like can be formed in an inner region adjacent to the inductor element of the semiconductor substrate.

An example semiconductor device of the present disclosure includes a semiconductor substrate including at least one of a circuit and a circuit element, and an inductor element having a coil axis extending in a direction parallel to a main surface of the semiconductor substrate and disposed adjacent to the main surface. A main direction of a magnetic field induced by passing a current through the inductor element is parallel to the main surface.

With such a structure, the magnetic field induced by the inductor element has substantially no influence on the inside of the semiconductor substrate. As a result, substantially no eddy current is induced, and therefore, a loss in the inductor element can be reduced even at a high frequency.

Moreover, because substantially no eddy current is induced, it is not necessary to form a diffusion layer or the like for forming a depletion layer in the semiconductor substrate below the inductor element, which requires a relatively large area, and therefore, a circuit and a circuit element can be provided in the semiconductor substrate below the inductor element. Therefore, the flexibility of layout of a circuit and a circuit element can be increased, and the chip area of the semiconductor device can be reduced, which are significant advantages.

Another example semiconductor device of the present disclosure includes a semiconductor substrate including at least one of a circuit and a circuit element, and an inductor element disposed adjacent to a main surface of the semiconductor substrate and disposed in a plane perpendicular to the main surface. A main direction of a magnetic field induced by passing a current through the inductor element is parallel to the main surface.

With such a structure, the magnetic field induced by the inductor element has substantially no influence on the inside of the semiconductor substrate. As a result, substantially no eddy current is induced, and therefore, a loss in the inductor element can be reduced even at a high frequency.

Moreover, because substantially no eddy current is induced, it is not necessary to form a diffusion layer or the like for forming a depletion layer in the semiconductor substrate below the inductor element, which requires a relatively large area, and therefore, a circuit and a circuit element can be provided in the semiconductor substrate below the inductor element. Therefore, the flexibility of layout of a circuit and a circuit element can be increased, and the chip area of the semiconductor device can be reduced, which are significant advantages.

The semiconductor device may further include a substrate or a block disposed adjacent to the main surface of the semiconductor substrate and made of a semiconductor material, a high-resistance material, or an insulating material. The inductor element may be supported by the substrate or the block.

With such a structure, the inductor element is firmly fixed and disposed, whereby the characteristic and reliability of the inductor element can be further improved.

The semiconductor device may further include conductor pads formed in the main surface of the semiconductor substrate. The inductor element may include a pair of connection terminals electrically connected to the semiconductor substrate via the conductor pads.

With such a structure, the inductor element is reliably connected to a circuit and a circuit element formed in the semiconductor substrate, whereby the characteristic and reliability of the inductor element can be further improved.

The connection terminals and the conductor pads may be connected via gold bumps. With such a structure, the inductor element can be more easily mounted to the main surface of the semiconductor substrate.

The inductor element may include a winding having one or more turns. With such a structure, a higher inductance can be obtained.

The pair of connection terminals of the inductor element may be oriented in the same direction. With such a structure, the inductor element can be manufactured at lower cost and can be more easily mounted to the main surface of the semiconductor substrate.

There may be a plurality of the inductor elements. With such a structure, a functional device, such as a transformer element including inductor elements, or the like, can be provided on the main surface of the semiconductor substrate at a high packaging density.

No two of the inductor elements may be inductively coupled with each other. With such a structure, a circuit in which the inductor element is employed in each circuit block can be properly operated.

At least two of the inductor elements may be inductively coupled with each other. With such a structure, elements, such as transformer elements or the like, which are magnetically inductively coupled can be formed on the main surface of the semiconductor substrate at a high packaging density.

According to the example semiconductor devices of the present disclosure, even when inductor elements are formed at a high packaging density, substantially no eddy current occurs in the semiconductor substrate, and therefore, there is substantially no loss due to an eddy current which would be otherwise caused by the inductor element, and the characteristic of the inductor element can be maintained. Moreover, a circuit or a circuit element can be provided in the semiconductor substrate below or in the vicinity of the inductor element, and therefore, the area of the semiconductor substrate can be efficiently used, whereby the chip size of the semiconductor device can be reduced.

BRIEF DESCRIPTION OF THE DRAWINGS

FIGS. 1A and 1B are perspective views schematically showing a structure of a semiconductor device 100 according to a first embodiment of the present disclosure.

FIG. 1C is a side view of FIG. 1B.

FIG. 8A is a cross-sectional view showing details of main parts including an inductor element of a semiconductor device 100 according to a seventh embodiment of the present disclosure, particularly a spiral interconnect 121 taken along a predetermined plane perpendicular to a main surface of a silicon substrate 131.

FIGS. 8B-8D are cross-sectional front views taken along line VIIIb-VIIIb of FIG. 8A.

FIG. 9A is a cross-sectional view showing details of main parts including another inductor element of the semiconductor device 100 of the seventh embodiment of the present disclosure, particularly a spiral interconnect 128 taken along a predetermined plane perpendicular to the main surface of the silicon substrate 131.

FIG. 9B is a cross-sectional front view taken along line IXb-IXb of FIG. 9A.

DETAILED DESCRIPTION

Figure 2:
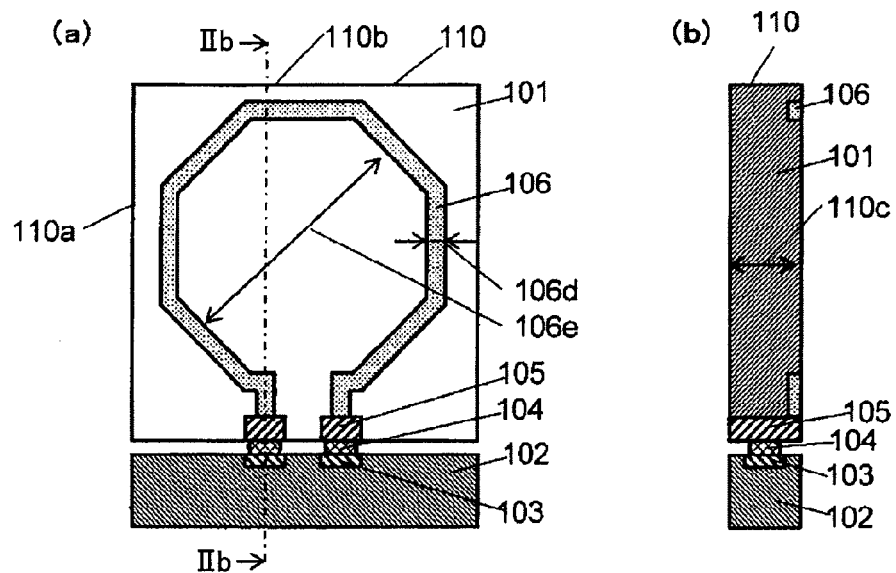
FIG. 2A is a front view showing details of main parts including an inductor element 106 of the semiconductor device 100 of FIGS. 1A-1C.
FIG. 2B is a cross-sectional view taken along line IIb-IIb of FIG. 2A.

Semiconductor devices according to illustrative embodiments of the present disclosure will be described hereinafter with reference to the accompanying drawings. Note that like parts are indicated by like reference characters throughout the specification and the drawings. For ease of understanding, components are schematically shown in the drawings.

First Embodiment

FIGS. 1A-1C are diagrams schematically showing semiconductor devices 100 according to a first embodiment of the present disclosure. FIGS. 1A and 1B are perspective views and FIG. 1C is a side view of FIG. 1B. FIGS. 2A and 2B are diagrams showing details of main parts including an inductor element 106 of the semiconductor device 100. FIG. 2A is a front view of the inductor element 106 and FIG. 2B is a cross-sectional view taken along line IIb-IIb of FIG. 2A. Note that, in FIGS. 2A and 2B, cross-sections of a semiconductor substrate 102 and connection pads 103 are shown to indicate a connection with the inductor element 106 in detail.

As shown in FIG. 1A, a semiconductor device 100 includes a semiconductor substrate 102 including at least one of a circuit (not shown) and a circuit element (not shown), and an inductor element 106 which is disposed adjacent a main surface 102a of the semiconductor substrate 102 and in a plane perpendicular to the main surface 102a. In the semiconductor device 100, a main direction of a magnetic field 106a induced by passing a current through the inductor element 106 is assumed to be parallel to the main surface 102a.

Similarly, as shown in FIG. 1B, a semiconductor device 100 includes a semiconductor substrate 102 including at least one of a circuit (not shown) and a circuit element (not shown), and an inductor element 106 which has a coil axis 106b extending in a direction parallel to the main surface 102a of the semiconductor substrate 102 and is disposed adjacent to the main surface 102a. In the semiconductor device 100, a main direction of a magnetic field 106a induced by passing a current through the inductor element 106 is assumed to be parallel to the main surface 102a. Here, although not shown, an active element, such as a transistor, a diode, or the like, a passive element, such as a resistor, a capacitor, or the like, and an interconnect, a contact plug, a connection terminal, and the like are formed in the semiconductor substrate 102 by a commonly used method, to constitute a circuit and a circuit element which achieve a predetermined function.

Here, in FIGS. 1A and 1B, the number of turns of the winding of the inductor element 106 is different. While the winding of FIG. 1A has one turn, the winding of FIG. 1B has two or more turns.

With such a structure, as shown in FIG. 1C, magnetic fields 106a and 106c induced by the inductor element 106 can be hindered or prevented from affecting the inside of the semiconductor substrate 102. As a result, substantially no eddy current is induced, whereby a loss in the inductor element 106 can be reduced even at a high frequency.

Moreover, because substantially no eddy current is induced, it is not necessary to form a diffusion layer or the like for forming a depletion layer in the semiconductor substrate 102 below the inductor element 106, which requires a relatively large area, and therefore, a circuit and a circuit element can be provided in the semiconductor substrate 102 below the inductor element 106. Specifically, a circuit and a circuit element can be provided in an inner region 102b of the semiconductor substrate 102 below the inductor element 106 as shown in FIG. 1C. Therefore, the flexibility of layout of a circuit and a circuit element can be increased, and the chip area of the semiconductor device 100 can be reduced, which are significant advantages.

The inductor elements 106 of FIGS. 1A-1C are supported by a substrate 101 or a block 101a made of a semiconductor material, a high-resistance material, or an insulating material. Specifically, the substrate 101 or the block 101a is also disposed adjacent to the main surface of the semiconductor substrate 102.

With such a structure, the inductor element 106 is firmly fixed and disposed, whereby the characteristic and reliability of the inductor element 106 can be further improved.

FIGS. 2A and 2B show the inductor element 106 which is an inductor 110 formed and supported on the substrate 101 made of, for example, a high-resistance silicon semiconductor. The inductor 110 is mechanically and electrically connected to the connection pads 103 formed in the main surface 102a of the semiconductor substrate 102 of FIGS. 1A-1C and FIGS. 2A and 2B. Specifically, as shown in FIGS. 2A and 2B, a pair of connection terminals 105 of the inductor element 106 are electrically connected to the semiconductor substrate 102 via the connection pads 103. The connection terminals 105 are connected to the connection pads (conductor pad) 103 via gold bumps 104.

With such a structure, the inductor element 106 is reliably connected to a circuit and a circuit element formed in the semiconductor substrate 102, whereby the characteristic and reliability of the inductor element 106 can be further improved. As a result, the inductor element 106 can be more easily mounted to the main surface 102a of the semiconductor substrate 102.

As is different from conventional chip inductors, the inductor 110 can be fabricated by a state-of-the-art semiconductor microfabrication process using a semiconductor substrate, such as a silicon substrate or the like, whereby the inductor 110 can be made considerably small and compact. The inductor 110 of FIG. 2A has, for example, a side 110a of 200 μm, a side 110b of 200 μm and a thickness 110c of 50 μm, i.e., is small and compact. An inductor conductive line constituting the inductor element 106 is often made of copper, aluminum, or an aluminum compound in view of cost or ease of processing. For example, when the inductor conductive line has a line width 106d of 10 μm and an interval 106e of 110 μm, the inductance value is 6 nH at a frequency of 4 GHz.

The inductor element 106 is estimated to have an influence on another circuit element or the like due to inductive coupling if the distance between the inductor element 106 and the circuit element is about 100 μm or less. Therefore, if the inductor element 106 is disposed adjacent to the semiconductor substrate 102, taking this distance into consideration, then even when an eddy current is induced, there is substantially no influence of the eddy current.

Note that, in order to improve the inductor characteristic, it is preferable to employ a high-resistance substrate, an insulating substrate, or the like which has a higher resistance than that of semiconductor substrates. The inductor conductive line is made of any conductive material, such as gold, silver, platinum, or the like, depending on the function, characteristic, or the like of the circuit to be formed.

Although the substrate 101 is a high-resistance semiconductor substrate in this embodiment, the present disclosure is not limited to this. The substrate 101 is preferably made of an insulating material, such as quartz, ceramic, or the like.

Second Embodiment

Figure 3:
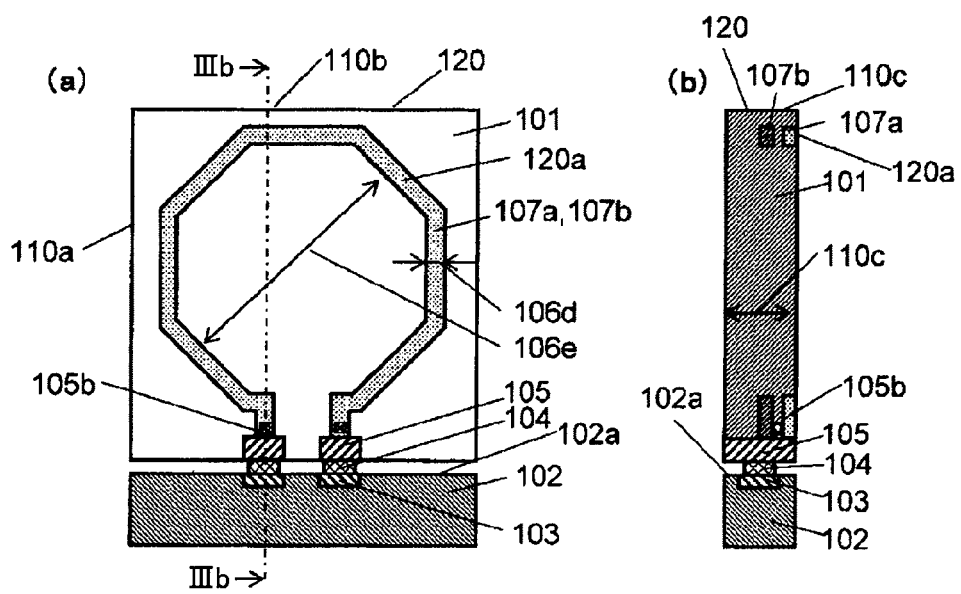
FIG. 3A is a front view showing details of main parts including inductor elements 107a and 107b of a semiconductor device 100 according to a second embodiment of the present disclosure.
FIG. 3B is a cross-sectional view taken along line IIIb-IIIb of FIG. 3A.

FIGS. 3A and 3B are diagrams showing details of main parts including inductor elements 107a and 107b of a semiconductor device 100 according to a second embodiment of the present disclosure. FIG. 3A is a front view of the inductor elements 107a and 107b and FIG. 3B is a cross-sectional view taken along line IIIb-IIIb of FIG. 3A. Note that, in FIGS. 3A and 3B, cross-sections of a semiconductor substrate 102 and connection pads 103 are shown to indicate a connection with the inductor elements 107a and 107b in detail.

As is different from the one-turn inductor 110 of FIGS. 2A and 2B of the first embodiment, an inductor 120 shown in FIGS. 3A and 3B has a double-layer structure in which the inductor elements 107a and 107b provided on or in a substrate 101 constitute a two-turn winding. The other portion of the inductor 120 has a structure similar to that of the inductor 110 of FIGS. 2A and 2B, i.e., the inductor 120 is connected to the connection pads 103 of the semiconductor substrate 102 via connection terminals 105 and gold bumps 104 of the substrate 101.

Specifically, as shown in FIGS. 3A and 3B, the inductor 120 includes the inductor elements 107a and 107b, which are connected to each other via a connection portion 105b. Therefore, in this embodiment, because the inductor elements 107a and 107b connected to each other to form a multilayer structure, a higher inductance value than that of the first embodiment can be obtained. The inductor 120 has an inductance of 12 nH at a frequency of 4 GHz because the inductor elements 107a and 107b have the same shape as that of the inductor element 106.

The pair of connection terminals 105 of the inductor elements 107a and 107b are formed and oriented in the same direction. With such a structure, the inductor elements 107a and 107b can be manufactured at lower cost and can be more easily mounted onto a main surface 102a of the semiconductor substrate 102. Moreover, advantageously, the same inductance value can be obtained by an inductor having a smaller diameter than that of a one-turn inductor.

The inductor 120 of this embodiment generates a higher density of magnetic flux than that of the first embodiment. However, because a winding plane 120a of the winding of the inductor elements 107a and 107b is substantially perpendicular to the main surface 102a of the semiconductor substrate 102, the inductor elements 107a and 107b generate a magnetic field substantially parallel to the main surface 102a. As a result, substantially no eddy current is generated in the semiconductor substrate 102, i.e., there is substantially no loss due to an eddy current.

Third Embodiment

Figure 4:
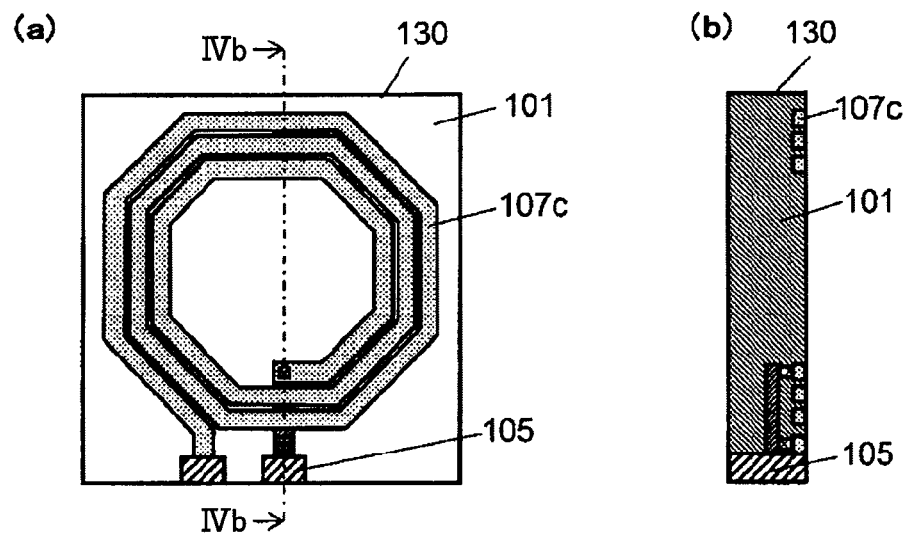
FIG. 4A is a front view showing details of main parts including an inductor element 107c of a semiconductor device 100 according to a third embodiment of the present disclosure.
FIG. 4B is a cross-sectional view taken along line IVb-IVb of FIG. 4A.

FIGS. 4A and 4B are diagrams showing details of main parts including an inductor element 107c of a semiconductor device 100 according to a third embodiment of the present disclosure. FIG. 4A is a front view of the inductor element 107c and FIG. 4B is a cross-sectional view taken along line IVb-IVb of FIG. 4A.

An inductor 130 of this embodiment has the following advantage in addition to those of the first embodiment. Here, the inductor element 107c has an increased number of turns, whereby a higher inductance value than that of the first embodiment can be obtained. Specifically, the inductor element 107c of FIGS. 4A and 4B includes a winding having one or more turns. Because the inductor element 107c includes a winding having about three turns, an inductance value which is about three times as high as that of a one-turn winding can be obtained.

Fourth Embodiment

Figure 5:
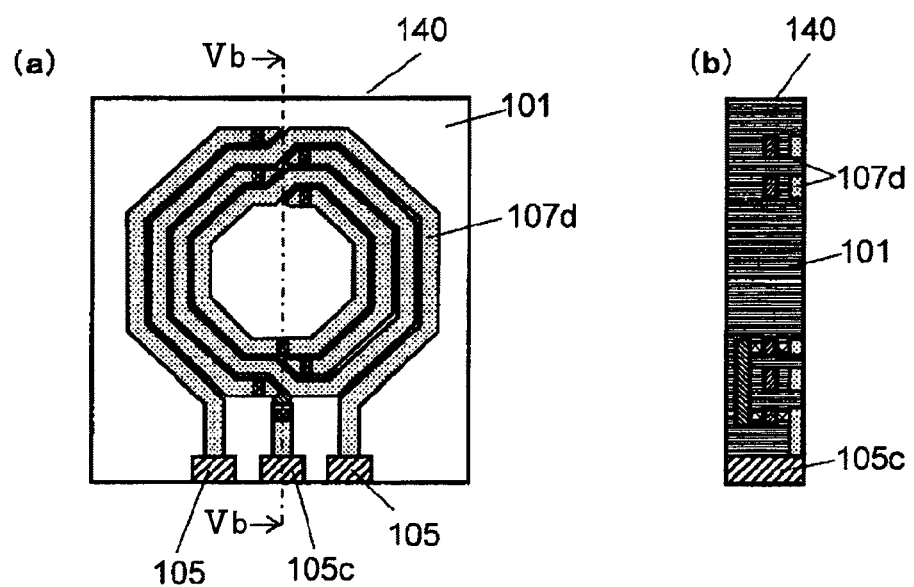
FIG. 5A is a front view showing details of main parts including an inductor element 107d of a semiconductor device 100 according to a fourth embodiment of the present disclosure.
FIG. 5B is a cross-sectional view taken along line Vb-Vb of FIG. 5A.

FIGS. 5A and 5B are diagrams showing details of main parts including an inductor element 107d of a semiconductor device 100 according to a fourth embodiment of the present disclosure. FIG. 5A is a front view of the inductor element 107d and FIG. 5B is a cross-sectional view taken along line Vb-Vb of FIG. 5A.

An inductor 140 of this embodiment has the following advantage in addition to those of the first embodiment. As shown in FIGS. 5A and 5B, the inductor element 107d includes a winding having a plurality of turns, and a connection terminal 105c disposed at a middle point of the inductor element 107d. With such a structure, the inductor 140 can operate as a differential inductor as well as a typical inductor.

Fifth Embodiment

FIGS. 6A-6D are cross-sectional views showing for describing a method for fabricating a semiconductor device according to a fifth embodiment of the present disclosure in the order in which the device is fabricated. Specifically, FIGS. 6A-6D shows a method for fabricating an inductor for use in the semiconductor devices 100 of the first to fourth embodiments using a semiconductor microfabrication technique.

Figure 6:
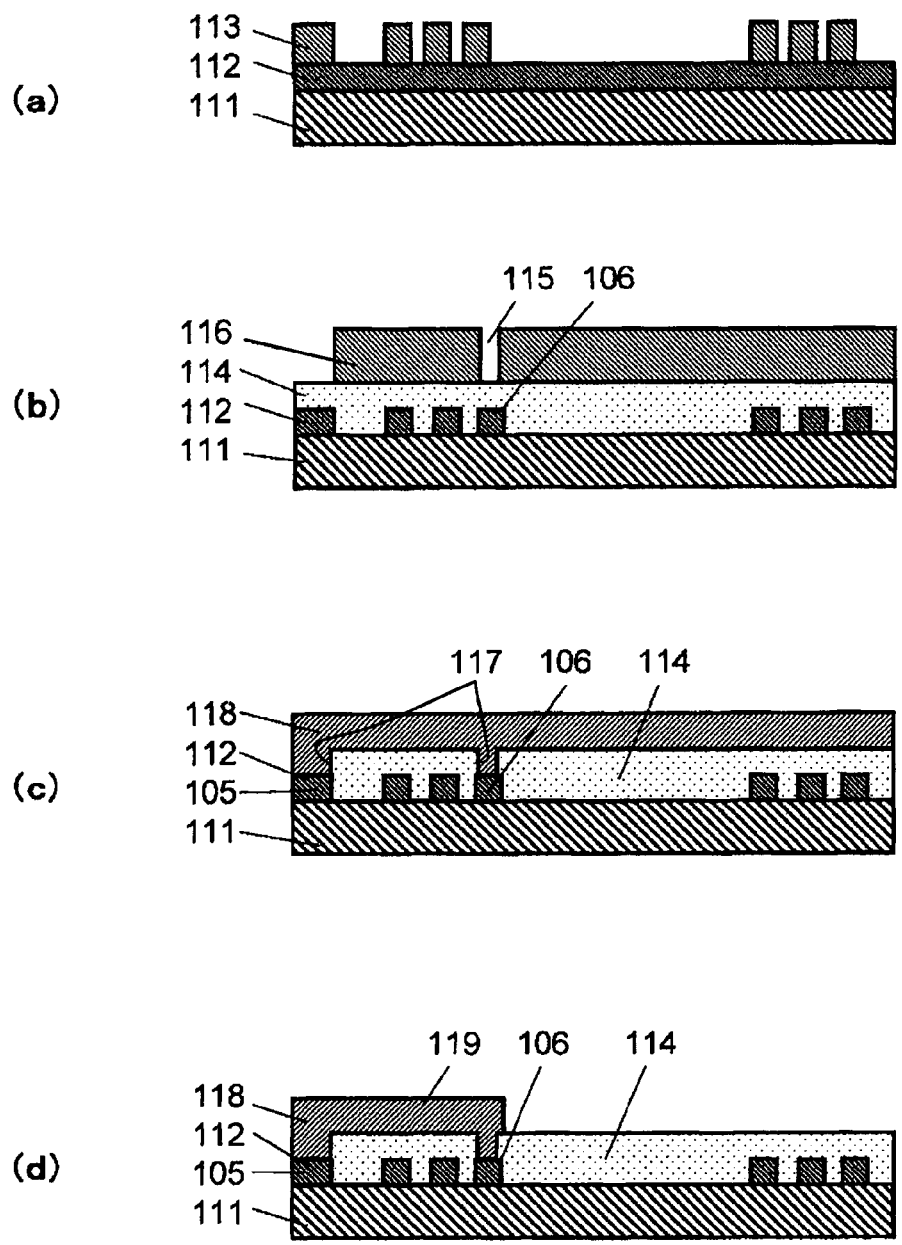
FIGS. 6A-6D are cross-sectional views showing for describing a method for fabricating a semiconductor device according to a fifth embodiment of the present disclosure in the order in which the device is fabricated, specifically showing a method for fabricating an inductor for use in the semiconductor devices 100 of the first to fourth embodiments using a semiconductor microfabrication technique.

Initially, as shown in FIG. 6A, for example, an aluminum layer 112 having a thickness of 1 μm is formed on an insulating film (not shown) provided on a high-resistance silicon substrate 111 having a thickness of 100 μm by sputtering. Next, a resist pattern 113 is formed on the aluminum layer 112 in order to form a spiral pattern for an inductor element.

Next, as shown in FIG. 6B, the aluminum layer 112 is shaped into the spiral pattern by etching using the resist pattern 113, and thereafter, the resist pattern 113 is removed using an organic solvent or the like. Next, a silicon oxide film (SiO$_x$) or a silicon nitride film (SiN$_x$) is deposited on the silicon substrate 111 by, for example, chemical vapor deposition (CVD) to cover the patterned aluminum layer 112, and thereafter, a surface of the film surface is caused to be even by chemical mechanical polishing (CMP) or the like, to form an interlayer insulating film 114 having a thickness of 1.5 µm. Next, a resist pattern 116 having an opening pattern 115 for through-holes is formed in order to form a lead interconnect pattern for connecting the patterned aluminum layer 112 which is to be the inductor element 106 and the patterned aluminum layer 112 which is to be the connection terminals 105.

Next, as shown in FIG. 6C, through-holes 117 which reach the patterned aluminum layers 112 which are to be the inductor element 106 and the connection terminals 105 are formed in the interlayer insulating film 114 by etching using the resist pattern 116, and thereafter, the resist pattern 116 is removed using an organic solvent or the like. Next, a conductive film 118 having a thickness of 1.5 µm which is to be a lead interconnect 119 is formed by, for example, sputtering on the interlayer insulating film 114 in which the through-holes 117 are formed.

Next, as shown in FIG. 6D, the unwanted portion of the conductive film 118 is removed by etching or the like to form the lead interconnect 119. Thus, the inductor 110 is completed.

By the aforementioned steps, the inductors 110, 120, 130, and 140 of the first to fourth embodiments can be fabricated. The steps can be used to simultaneously fabricate a large number of inductors on the silicon substrate 111 having a diameter of, for example, 300 mm using a semiconductor process. The individual inductors are finally obtained by cleaving the silicon substrate 111 into chips.

A transformer element and the like which will be described below can be fabricated using the aforementioned steps.

Sixth Embodiment

Figure 7:
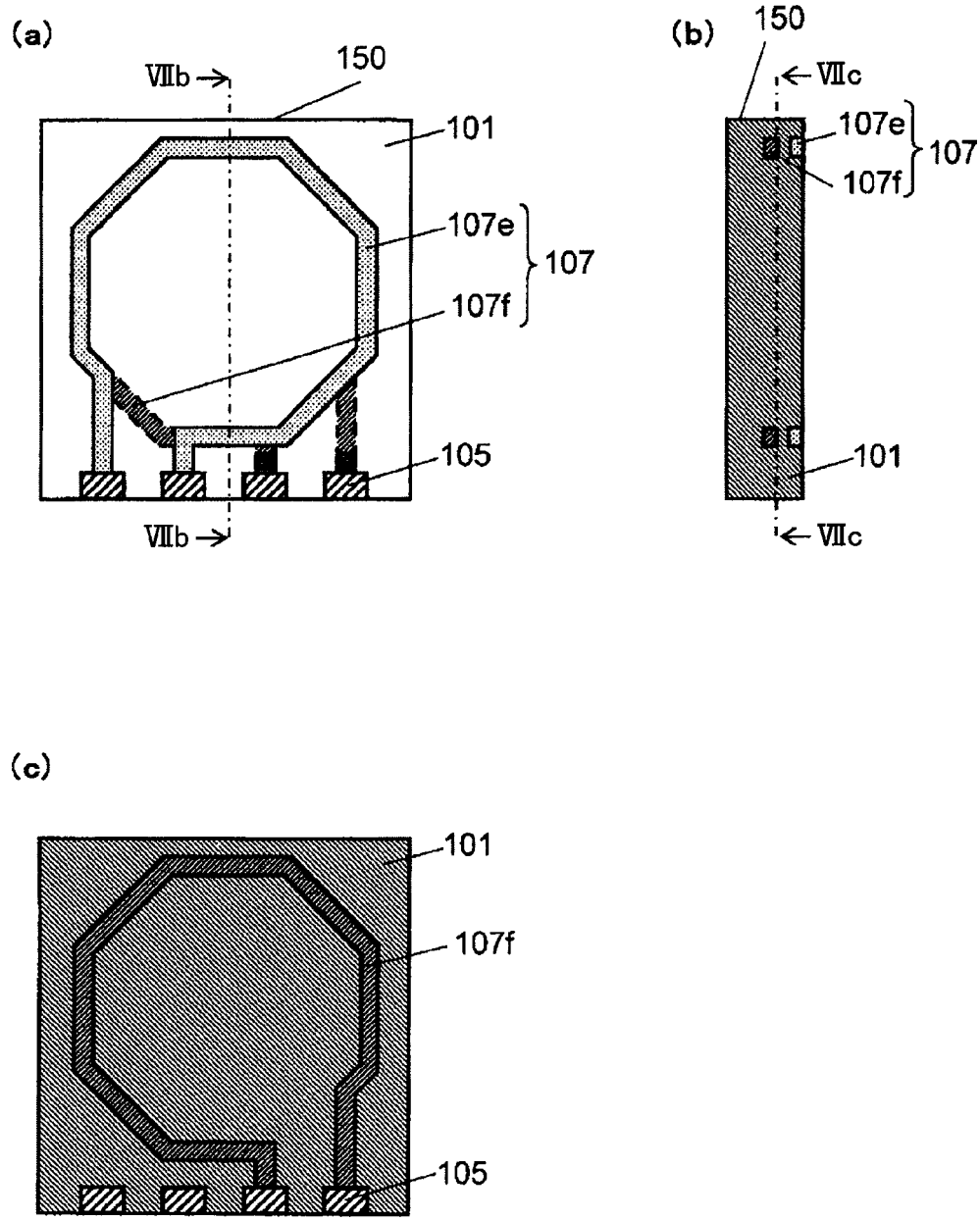
FIG. 7A is a front view showing details of main parts including inductor elements 107e and 107f of a semiconductor device 100 according to a sixth embodiment of the present disclosure.
FIG. 7B is a cross-sectional view taken along line VIIb-VIIb of FIG. 7A.
FIG. 7C is a cross-sectional view taken along line VIIc-VIIc of FIG. 7B.

FIGS. 7A-7C are diagrams showing details of main parts including inductor elements 107e and 107f of a semiconductor device 100 according to a sixth embodiment of the present disclosure. FIG. 7A is a front view of the inductor elements 107e and 107f, FIG. 7B is a cross-sectional view taken along line VIIb-VIIb of FIG. 7A, and FIG. 7C is a cross-sectional view taken along line VIIc-VIIc of FIG. 7B.

As shown in FIGS. 7A-7C, an inductor 150 includes a plurality of inductor elements 107e and 107f. The inductor elements 107e and 107f are disposed to be inductively coupled with each other.

Such a structure has the following advantage in addition to those of the first embodiments. Specifically, the inductor elements 107e and 107f are disposed on the primary and secondary sides, respectively, so that the inductor elements 107e and 107f are inductively coupled with each other. Therefore, the inductor elements 107e and 107f can operate as a transformer element 107, i.e., the inductor elements 107e and 107f can be formed as the transformer element 107.

As a result, a functional device, such as the transformer element 107 including the inductor elements 107e and 107f, or the like, can be provided on a main surface 102a of a semiconductor substrate 102 at a high packaging density.

Seventh Embodiment

FIGS. 8A-8D are diagrams showing details of main parts including an inductor element of a semiconductor device 100 according to a seventh embodiment of the present disclosure. FIG. 8A is a cross-sectional view of a spiral interconnect 121 taken along a predetermined plane perpendicular to a main surface of a silicon substrate 131, and FIGS. 8B-8D are cross-sectional front views taken along line VIIIb-VIIIb of FIG. 8A.

FIG. 8A shows a structure of the spiral interconnect 121 taken along the predetermined plane perpendicular to the main surface when a multilayer structure is formed on the silicon substrate 131 using a semiconductor microfabrication technique. The spiral interconnect 121 is disposed on the silicon substrate 131 with an interlayer insulating film 114 being interposed therebetween. The spiral interconnect 121 includes a metal layer 122, and plugs 123a buried in via-holes 123, and is connected to electrodes 124. Note that the spiral interconnect 121 is surrounded and supported by the interlayer insulating film 114.

FIG. 8B is a cross-sectional front view taken along line VIIIb-VIIIb of FIG. 8A. As can be seen from FIG. 8B, an inductor element 125 is formed.

FIG. 8C is a cross-sectional front view taken along line VIIIb-VIIIb of FIG. 8A. As can be seen from FIG. 8C, a connection terminal 125c is formed between inductor elements 125a and 125b so that a differential inductor 126 is formed as a whole.

FIG. 8D is a cross-sectional front view taken along line VIIIb-VIIIb of FIG. 8A. As can be seen from FIG. 8D, inductor elements 125d and 125e are disposed parallel to each other so that the inductor elements 125d and 125e are inductively coupled, and a transformer element 127 is formed as a whole.

FIGS. 9A and 9B are diagrams showing details of main parts including another inductor element of the semiconductor device 100 of the seventh embodiment of the present disclosure. FIG. 9A is a cross-sectional view of a spiral interconnect 128 taken along a predetermined plane perpendicular to the main surface of the silicon substrate 131, and FIG. 9B is a cross-sectional front view taken along line IXb-IXb of FIG. 9A.

FIG. 9A shows a structure of the spiral interconnect 128 similar to that of FIG. 8A, taken along the predetermined plane perpendicular to the main surface when a multilayer structure is formed on the silicon substrate 131 using a semiconductor microfabrication technique. The spiral interconnect 128 of FIG. 9A is formed as a winding having a plurality of turns, as is different from the spiral interconnect 121 of FIG. 8A.

The spiral interconnect 128 is disposed on the silicon substrate 131 with an interlayer insulating film 114 being interposed therebetween. The spiral interconnect 128 includes a metal layer 122, and plugs 123a buried in via-holes 123, and is connected to electrodes 124. Note that the multi-turn spiral interconnect 128 is surrounded and supported by the interlayer insulating film 114.

Thus, a plurality of inductor elements are provided, and at least two of these inductor elements are disposed to be inductively coupled with each other. As a result, elements, such as transformer elements or the like, which are magnetically inductively coupled can be formed on a main surface of a semiconductor substrate at a high packaging density.

Eighth Embodiment

Figure 10:
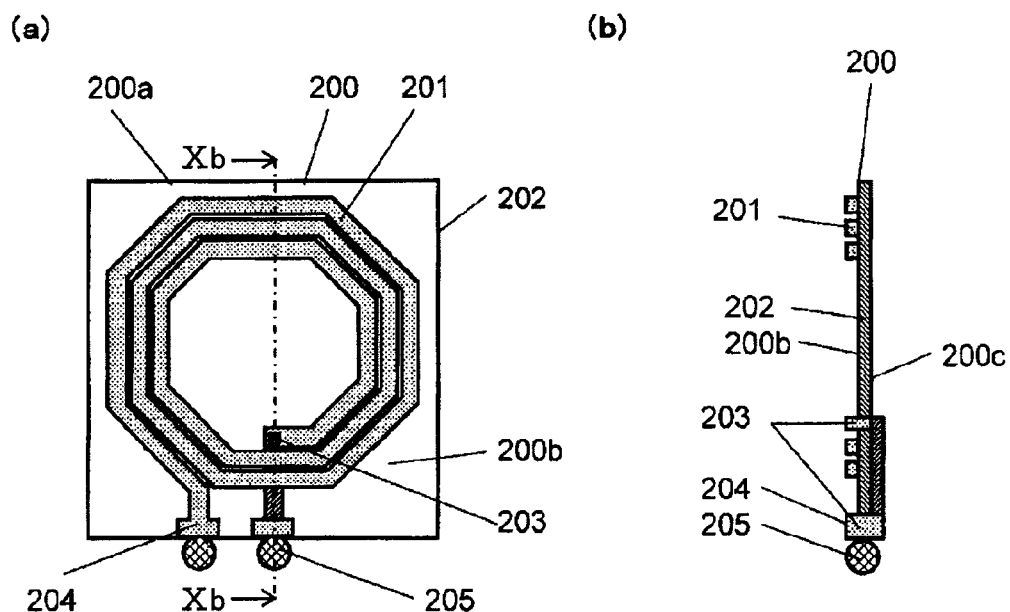
FIG. 10A a front view showing main parts including an inductor element 201 of a semiconductor device 100 according to an eighth embodiment of the present disclosure.
FIG. 10B is a cross-sectional view taken along line Xb-Xb of FIG. 10A.

FIGS. 10A and 10B are diagrams showing main parts including an inductor element 201 of a semiconductor device 100 according to an eighth embodiment of the present disclosure. FIG. 10A is a front view of the inductor element 201 and FIG. 10B is a cross-sectional view taken along line Xb-Xb of FIG. 10A.

As is different from the inductor 110 and the like of the first to seventh embodiments, an inductor 200 shown in FIGS. 10A and 10B includes an insulating substrate (e.g., a resin substrate), and metal thin films made of copper or the like attached to opposite surfaces thereof. Specifically, in the inductor 200, a spiral-shaped inductor element 201 is attached to a front surface 200b of a resin substrate 202 which is in the shape of a square with a side 200a of 500 μm. The winding of the inductor element 201 is assumed to have a line width of 30 μm and a line-to-line pitch of 15 μm. The front surface 200b of the resin substrate 202 is electrically and mechanically connected to a rear surface 200c thereof via through-electrodes 203 which are formed by forming through-holes in the resin substrate 202 and burying copper plating in the through-holes. For example, gold bumps 205 having a diameter of 60 μm are formed adjacent to a pair of connection terminals 204 for connecting the inductor 200 to a semiconductor substrate (not shown). The pair of connection terminals 204 are connected via the gold bumps 205 to the semiconductor substrate (not shown).

Note that the resin substrate 202 has a thickness of, for example, 100 μm, and the copper winding has a thickness of, for example, 40 μm, and therefore, the inductor element 201 has a volume of 1 mm$^3$ or less, i.e., is compact. The resin substrate 202 may be made of a paper-epoxy composite, a glass-epoxy composite, a glass-polyimide composite, a fluorocarbon resin, or the like. Needless to say, even when a substrate made of an insulating material, such as quartz, ceramic, or the like may be employed instead of the resin substrate 202, a similar advantage can be obtained.

Ninth Embodiment

Figure 11:
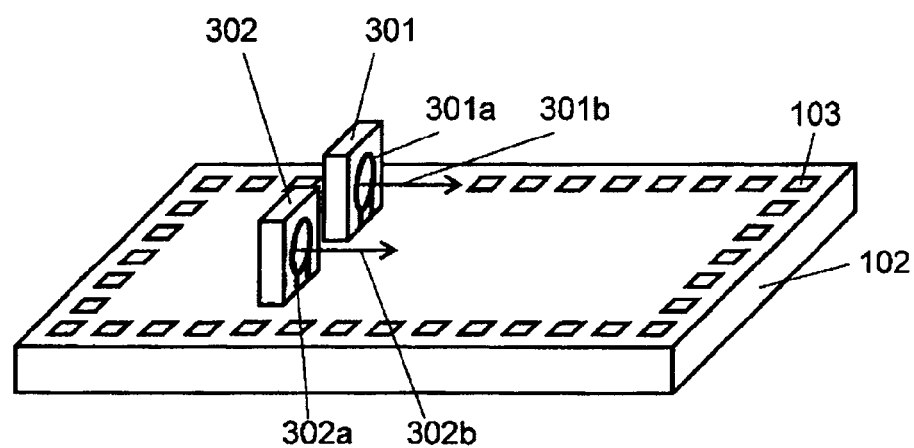
FIG. 11 is a perspective view schematically showing a structure of a semiconductor device 300 according to a ninth embodiment of the present disclosure.

FIG. 11 is a perspective view schematically showing a structure of a semiconductor device 300 according to a ninth embodiment of the present disclosure. As shown in FIG. 11, two inductors 301 and 302 are each vertically connected to a surface of a semiconductor substrate 102. Here, the inductors 301 and 302 are disposed so that magnetic fields 301b and 302b induced by passing a current through inductor elements 301a and 302a are not inductively coupled with each other.

With such a structure, the inductor elements 301a and 302a are disposed not to be inductively coupled with each other, and therefore, magnetic lines of force induced by one of the inductors 301 and 302 substantially do not generate electromotive force in the other. As a result, one of the inductors 301 and 302 substantially does not generate an eddy current in the other, whereby there is substantially no loss due to an eddy current in the inductor element 301a and 302a.

Although the two inductors 301 and 302 are provided in this embodiment, a larger number of inductors may be provided. In this case, the inductors can be disposed so that no two of the inductors are inductively coupled with each other.

Tenth Embodiment

Figure 12:
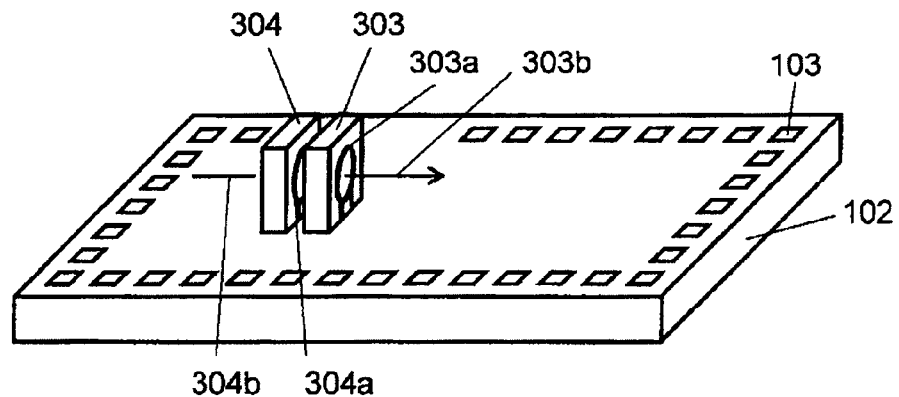
FIG. 12 is a perspective view schematically showing a structure of a semiconductor device 350 according to a tenth embodiment of the present disclosure.
Figure 13:
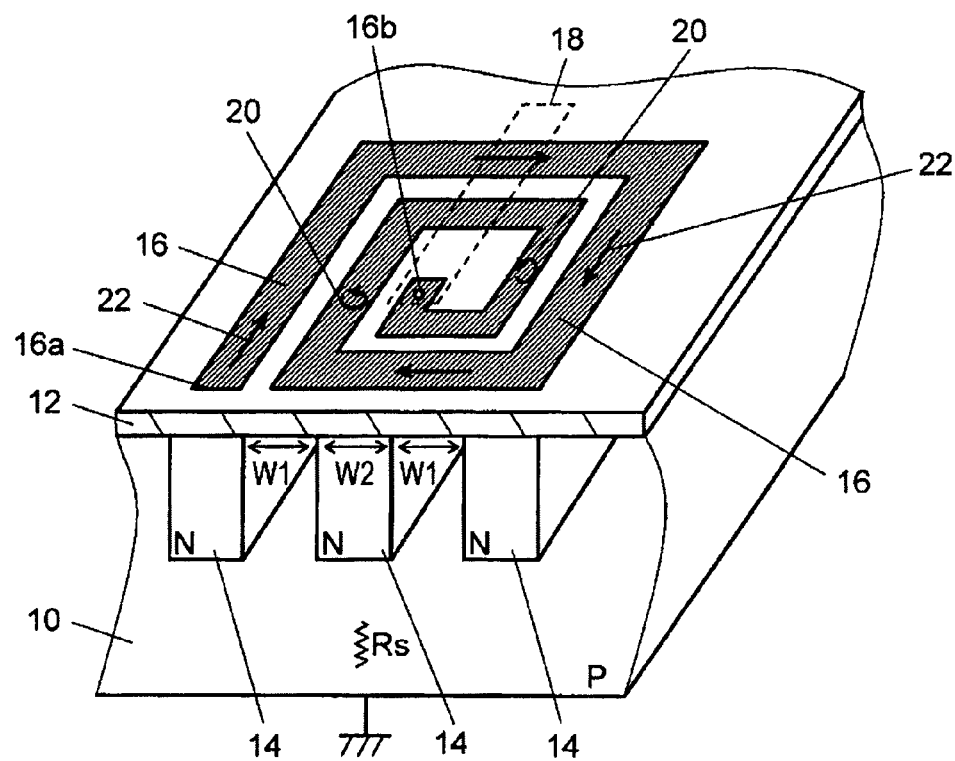
FIG. 13 is a schematic diagram showing a structure of a conventional inductor element.

FIG. 12 is a perspective view schematically showing a structure of a semiconductor device 350 according to a tenth embodiment of the present disclosure. As shown in FIG. 12, two inductors 303 and 304 are each vertically connected to a surface of a semiconductor substrate 102. Here, the inductors 303 and 304 are disposed so that magnetic fields 303b and 304b induced by passing a current through inductor elements 303a and 303a are inductively coupled with each other. Therefore, magnetic lines of force intentionally induced by one of the inductors 303 and 304 can generate electromotive force in the other inductor to an extent which allows an electrical circuit connected to the other inductor to utilize the electromotive force.

Although the two inductors 303 and 304 are provided in this embodiment, a larger number of inductors may be provided. In this case, the inductors are disposed so that at least two of the inductors are inductively coupled with each other.

As described in the ninth and tenth embodiments, in the semiconductor devices of the present disclosure, a plurality of inductors are disposed on a semiconductor substrate so that a plurality of inductor elements are or are not inductively coupled, depending on each circuit block on the semiconductor substrate. As a result, a magnetic circuit or a high-frequency circuit can be appropriately operated, and these circuits can have a compact size.

Although an example has been described in which the connection terminals of an inductor are connected to the connection pads of a semiconductor substrate via bumps in the semiconductor device of each embodiment of the present disclosure, the connection may be established using, for example, a wire, and in this case, a similar advantage can be obtained. Therefore, any similar connection techniques may be employed.

The pattern structure, such as the number of turns or layers, and the like, of the inductor element described in the embodiments of the present disclosure is not limited. Moreover, it will be clearly understood that the embodiments of the present disclosure are not intended to limit the specification and the formation technique of the substrate, the device structure of the semiconductor substrate, the interconnect layer, the layer material, the film thicknesses, the formation conditions, and the like, i.e., other structures and fabrication methods can be employed.

The technical aspects of the present disclosure have been described in detail with reference to the drawings. Various modifications and additions can be made to the embodiments disclosed herein without departing the spirit and scope of the present disclosure by those skilled in the art after understanding the present disclosure.

The illustrative semiconductor devices of the present disclosure have the effect of substantially eliminating a loss due to an eddy current caused by an inductor element, whereby a magnetic circuit or a high-frequency circuit can be appropriately operated and these circuits can have a compact size. Therefore, the present disclosure is applicable to semiconductor devices including an inductor element, such as a voltage controlled oscillator (VCO) circuit or the like. As a result, a compact size and high performance can be achieved, and therefore, the present disclosure is useful for these semiconductor devices.

What is claimed is:

1. A semiconductor device comprising:
   a semiconductor substrate including at least one of a circuit and a circuit element; and
   an inductor element having a coil axis extending in a direction parallel to a main surface of the semiconductor substrate and disposed adjacent to the main surface,
   wherein
   a main direction of a magnetic field induced by passing a current through the inductor element is parallel to the main surface,
   the inductor element is in a spiral shape,
   the inductor element is provided on a main surface of an insulating substrate,
   the insulating substrate has a metal thin film provided on a rear surface thereof, and the inductor element is electrically connected to the metal thin film via a through electrode provided in the insulating substrate.

2. The semiconductor device of claim 1, further comprising:
a substrate or a block disposed adjacent to the main surface of the semiconductor substrate and made of a semiconductor material, a high-resistance material, or an insulating material,
wherein the inductor element is supported by the substrate or the block.

3. The semiconductor device of claim 1, further comprising:
conductor pads formed in the main surface of the semiconductor substrate,
wherein the inductor element includes a pair of connection terminals electrically connected to the semiconductor substrate via the conductor pads.

4. The semiconductor device of claim 3, wherein the connection terminals and the conductor pads are connected via gold bumps.

5. The semiconductor device of claim 1, wherein the inductor element includes a winding having one or more turns.

6. The semiconductor device of claim 3, wherein the pair of connection terminals of the inductor element are oriented in the same direction.

7. The semiconductor device of claim 1, wherein there are a plurality of the inductor elements.

8. The semiconductor device of claim 7, wherein no two of the inductor elements are inductively coupled with each other.

9. The semiconductor device of claim 7, wherein at least two of the inductor elements are inductively coupled with each other.

10. A semiconductor device comprising:
a semiconductor substrate including at least one of a circuit and a circuit element; and
an inductor element disposed adjacent to a main surface of the semiconductor substrate and disposed in a plane perpendicular to the main surface,
wherein
a main direction of a magnetic field induced by passing a current through the inductor element is parallel to the main surface,
the inductor element is in a spiral shape,
the inductor element is provided on a main surface of an insulating substrate,
the insulating substrate has a metal thin film provided on a rear surface thereof, and
the inductor element is electrically connected to the metal thin film via a through electrode provided in the insulating substrate.

11. The semiconductor device of claim 10, further comprising:
a substrate or a block disposed adjacent to the main surface of the semiconductor substrate and made of a semiconductor material, a high-resistance material, or an insulating material,
wherein the inductor element is supported by the substrate or the block.

12. The semiconductor device of claim 10, further comprising:
conductor pads formed in the main surface of the semiconductor substrate,
wherein the inductor element includes a pair of connection terminals electrically connected to the semiconductor substrate via the conductor pads.

13. The semiconductor device of claim 12, wherein the connection terminals and the conductor pads are connected via gold bumps.

14. The semiconductor device of claim 10, wherein the inductor element includes a winding having one or more turns.

15. The semiconductor device of claim 12, wherein the pair of connection terminals of the inductor element are oriented in the same direction.

16. The semiconductor device of claim 10, wherein there are a plurality of the inductor elements.

17. The semiconductor device of claim 16, wherein no two of the inductor elements are inductively coupled with each other.

18. The semiconductor device of claim 16, wherein at least two of the inductor elements are inductively coupled with each other.

* * * * *